(12) United States Patent
Kauffman et al.

(10) Patent No.: US 10,817,035 B1
(45) Date of Patent: Oct. 27, 2020

(54) ELECTRICAL SYSTEM STABILITY

(71) Applicant: Facebook, Inc., Menlo Park, CA (US)

(72) Inventors: Michael Timothy Kauffman, Campbell, CA (US); Mingchun Xu, Danville, CA (US); Seung H. Park, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 155 days.

(21) Appl. No.: 16/165,590

(22) Filed: Oct. 19, 2018

(51) Int. Cl.
| | |
|---|---|
| *G06F 1/26* | (2006.01) |
| *H05K 7/14* | (2006.01) |
| *H02M 7/06* | (2006.01) |
| *H02M 1/42* | (2007.01) |
| *G05B 19/05* | (2006.01) |
| *H02M 3/155* | (2006.01) |

(52) U.S. Cl.
CPC .............. *G06F 1/26* (2013.01); *G05B 19/05* (2013.01); *H02M 1/4208* (2013.01); *H02M 3/155* (2013.01); *H02M 7/06* (2013.01); *H05K 7/1492* (2013.01); *G05B 2219/13095* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS

| | | | | |
|---|---|---|---|---|
| 2006/0050065 | A1* | 3/2006 | Maki .................... | G09G 3/3688 345/204 |
| 2009/0195295 | A1* | 8/2009 | Uematsu .................. | G06F 1/26 327/530 |
| 2010/0207594 | A1* | 8/2010 | Davoudi ............... | H02M 3/157 323/283 |
| 2011/0187457 | A1* | 8/2011 | Hsu .......................... | H03F 1/34 330/192 |
| 2014/0077847 | A1* | 3/2014 | Natsukawa ............... | G06F 1/26 327/109 |
| 2016/0011618 | A1* | 1/2016 | Janous ................... | G05B 15/02 700/291 |

* cited by examiner

*Primary Examiner* — Zahid Choudhury
(74) *Attorney, Agent, or Firm* — Van Pelt, Yi & James LLP

(57) ABSTRACT

A control logic firmware is received at a power supply unit. The firmware specifies a configuration selected to place a magnitude of an impedance of the power supply unit above a magnitude of an impedance of a network data center power system. The control logic firmware is executed using a power factor correction circuit of the power supply unit including by setting a voltage loop phase margin of the power factor correction circuit to maintain the magnitude of the impedance of the power supply unit above the magnitude of the impedance of the network data center power system.

20 Claims, 6 Drawing Sheets

ELECTRICAL SYSTEM STABILITY

BACKGROUND OF THE INVENTION

Data centers for large-scale web services typically require large enterprise-scaled power delivery systems. These systems are designed to receive megawatts of electrical power to provide the electrical power needs of the data center. To increase the efficiency of these data centers, one approach is to introduce a minimal amount of equipment between the electric utility service and the data center computer servers. The reduction of intermediate power supply equipment such as uninterruptible power supplies improves the efficiency of the overall system but increases the influence of the electrical properties of the upstream electrical system and can decrease the overall stability of the system. Therefore, there exists a need for a power supply unit that increases the electrical stability of the system with minimal impact to data center infrastructure.

BRIEF DESCRIPTION OF THE DRAWINGS

Various embodiments of the invention are disclosed in the following detailed description and the accompanying drawings.

DETAILED DESCRIPTION

Figure 1:
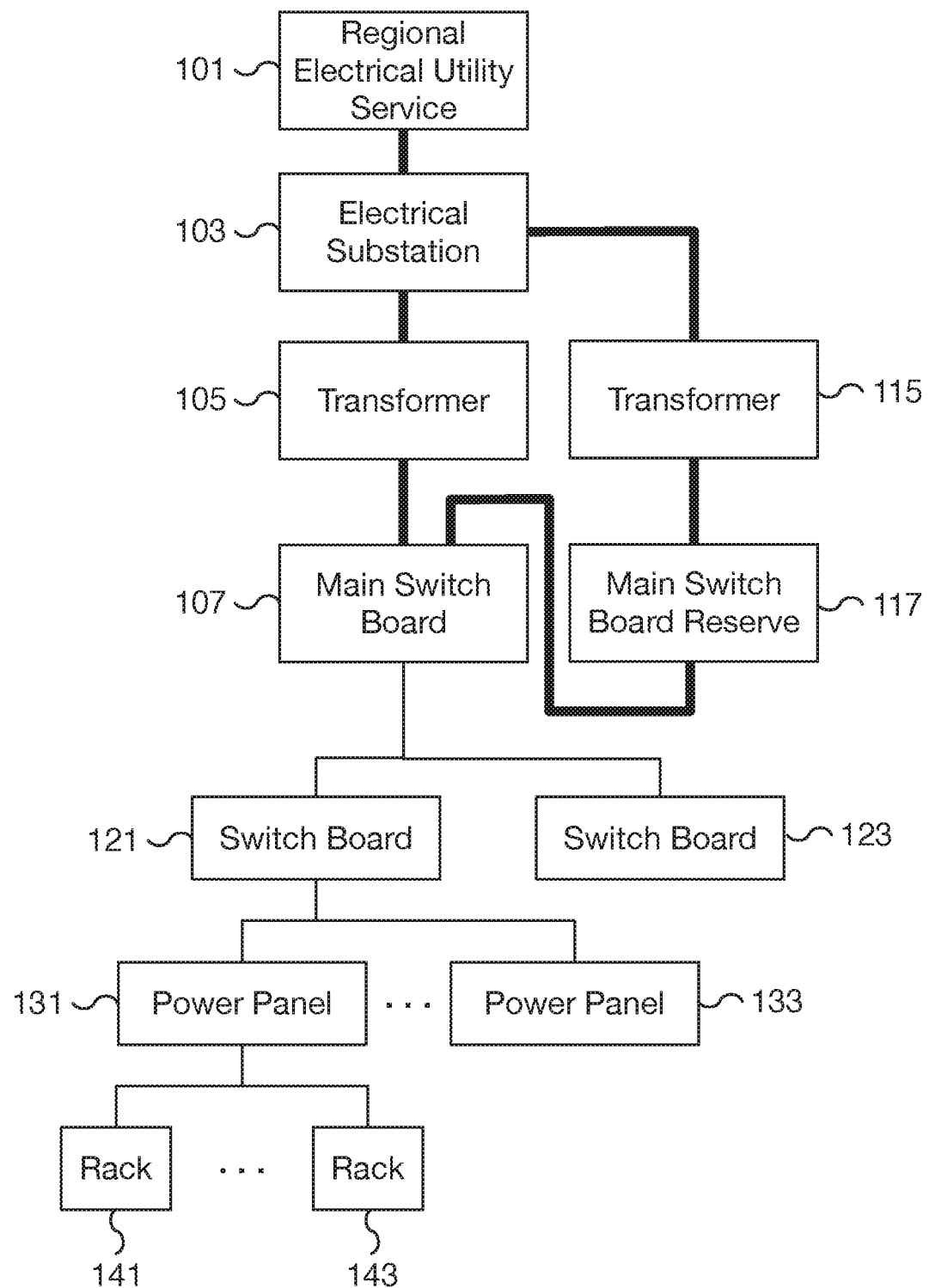
FIG. 1 is a block diagram illustrating an embodiment of a data center electrical system.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A power delivery system for improving the electrical system stability of a data center is disclosed. In certain scenarios, the impedance of a data center in relation to that of the power supplies it contains impacts the overall electrical stability of the data center system. As the magnitude of the impedance of the power supply approaches the magnitude of the impedance of the data center, the likelihood that the electrical system becomes unstable increases and problems such as mechanical vibrations, acoustic noise, and high and/or chaotic currents, among others, are introduced. To prevent the system from becoming unstable, the impedance of the power supply unit is adjusted in relation to the impedance of the data center system. For example, the firmware of a power supply unit is used to configure the operation of the power factor correction (PFC) circuit of the power supply unit. A PFC control module or PFC circuit adjusts the impedance of the power supply unit to maintain the magnitude of the impedance of the power supply unit above that of the network data center power system. In some embodiments, the PFC circuit modifies the voltage loop parameters of a power supply unit, such as the phase margin, to change the impedance of the power supply unit. In some embodiments, the power supply unit includes a switch control and the impedance of the power supply unit is adjusted in relation to the impedance of the data center system by configuring the operation of the switch control of the power supply unit. In some embodiments, the power supply unit is incorporated into a data center using AC power distribution. In some embodiments, the power supply unit is incorporated into a data center using DC power distribution. For example, a data center is connected to a distribution system using DC-to-DC converter circuits to change a higher DC voltage, such as −48 V DC, into lower voltages used by applicable components. In various embodiments, a DC-to-DC converter circuit component adjusts its impedance in relation to the impedance of the data center system to improve electrical system stability.

In some embodiments, control logic firmware is received at a power supply unit that specifies a configuration selected to place the magnitude of the impedance of the power supply unit above a magnitude of an impedance of a network data center power system. For example, the power supply unit of a data center receives a firmware that updates the operation of the power supply unit to meet the impedance envelope requirements for the power supply and data center power system for maintaining a stable electrical system. In some embodiments, the control logic firmware is executed using a power factor correction circuit of the power supply unit including by setting a voltage loop phase margin of the power factor correction circuit to maintain the magnitude of impedance of the power supply unit above the magnitude of the impedance of the network data center power system. For example, the received firmware controls the operation of the power factor correction (PFC) circuit to maintain the magnitude of the impedance of the power supply unit above that of the network data center power system. In some embodiments, a voltage loop phase margin is configured to increase the phase margin associated with the power supply unit to at least 45 degrees.

FIG. 1 is a block diagram illustrating an embodiment of a data center electrical system. In the example shown, the data center electrical system includes regional electrical utility service 101, electrical substation 103, transformer 105, main switch board (MSB) 107, transformer 115, main switch board reserve (MSBR) 117, switch boards 121 and 123, power panels 131 and 133, and racks 141 and 143. In various embodiments, a data center may utilize the configuration of FIG. 1 for running large-scale computing services such as web applications. In some embodiments, additional or fewer components may be used as appropriate. For example, additional switch boards, power panels, racks, etc. may be included in the configuration. As another example, transformer 115 and MSBR 117 may be optional.

In some embodiments, main switch board (MSB) 107 is one of multiple main switch boards attached to a transformer. Switch boards 121 and 123 are examples of switchboards attached to MSB 107. In some embodiments, additional switch boards are attached to each main switch board. Power panels 131 and 133 are examples of power panels attached to switch board 121. In some embodiments, additional power panels are attached to each switch board. Racks 141 and 143 are examples of racks attached to power panel 131. In some embodiments, additional racks are attached to each power panel. Racks, such as racks 141 and 143, are used to mount servers and the power supplies for the servers (not shown).

In some embodiments, regional electrical utility service 101 provides electrical power to electrical substation 103. For example, regional electrical utility service 101 may provide ~200 kV electrical power source to electrical substation 103. In some embodiments, electrical substation 103 is housed inside the data center. Electrical substation 103 provides electrical power to transformer 105 and transformer 115. In some embodiments, transformers 105 and 115 are pad-mounted transformers installed outside the data center electrical rooms. In some embodiments, transformers 105 and 115 receive high voltage and low current input from which they output a lower voltage and higher current. In some embodiments, transformers 105 and 115 step down the voltage by a factor of 30. Transformers 105 and 115 step down the voltage provided to main switch board (MSB) 107 and main switch board reserve (MSBR) 117. For example, transformers 105 and 115 may step down the voltage from ~13 kV down to 480 V.

In some embodiments, main switch board reserve (MSBR) 117 is a reserve power source for main switch board (MSB) 107. For example, MSBR 117 may be used as a backup power source for MSB 107. In various embodiments, each switch board such as MSB 107 and MSBR 117 further includes its own diesel generator (not shown). The generators may be used to provide electrical power to each switch board, for example, as a backup electrical source.

In some embodiments, main switch board (MSB) 107 provides power to power panels 131 and 133. MSB 107 also provides power to any additional connected power panels (not shown). Racks 141 and 143 are powered by power panel 131. In various embodiments, each power panel is used to power the racks connected to it. In some embodiments, each power panel is a reactive power panel and helps to stabilize the power source to the racks. Each rack, such as racks 141 and 143, includes one or more servers and power supplies (not shown). In some embodiments, a power supply converts a 277 V AC input voltage down to a DC 12.6 V output voltage to power a computer server. In various embodiments, the power supplies are configured to improve the electrical stability of the system.

Figure 2:
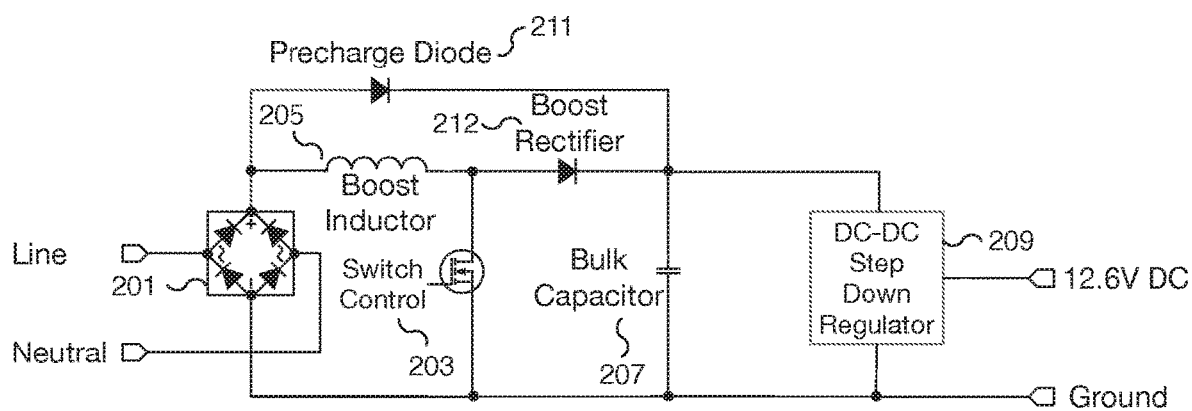
FIG. 2 a circuit block diagram illustrating an embodiment of a data center power supply.

FIG. 2 a circuit block diagram illustrating an embodiment of a data center power supply. In various embodiments, the data center power supply is used to increase the stability of the electrical system to ensure the data center operates efficiently and safely. In some embodiments, the circuit block diagram is a simplified block diagram of the actual power supply. In some embodiments, the data center power supply described by FIG. 2 is installed in the racks of a datacenter, such as in racks 141 and 143 of FIG. 1, and connected to a power panel, such as power panel 131 or 133 of FIG. 1. In the example shown, the circuit block diagram receives a line and neutral input and outputs a 12.6V DC and ground output. The circuit block diagram includes input diode bridge 201, switch control 203, boost inductor 205, bulk capacitor 207, DC-DC step down voltage regulator 209, precharge diode 211, and boost rectifier 212. In some embodiments, switch control 203 is a power factor correction (PFC) control component. In some embodiments, boost rectifier 212 is implemented using a diode.

In some embodiments, input diode bridge 201 is used during initial power-up to charge the power supply circuits and is not used in steady-state operation. Switch control 203 is configured to utilize boost inductor 205, precharge diode 211, and boost rectifier 212 to transform an input sinusoidal-line-to-neutral voltage to a regulated DC voltage. In some embodiments, the transformed DC voltage is approximately 450 V DC. In various embodiments, the DC voltage is stored on bulk capacitor 207. The bulk voltage on bulk capacitor 207 feeds DC-DC step down voltage regulator 209. In various embodiments, DC-DC step down voltage regulator 209 generates 12.6 V DC, which may be used to power a server rack such as racks 141 and 143 of FIG. 1.

In various embodiments, the operation of switch control 203 is configurable by the firmware of the power supply (not shown). The firmware can be used to control the operation of switch control 203 to maintain the magnitude of the impedance of the power supply unit above that of the network data center power system. In some embodiments, a voltage loop phase margin is configured to increase the phase margin associated with the power supply unit to at least 45 degrees.

Figure 3:
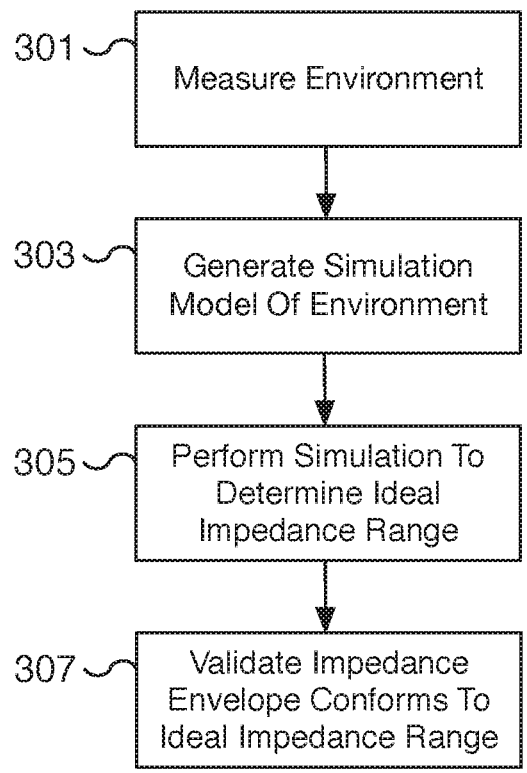
FIG. 3 is a flow diagram illustrating an embodiment of a process for determining the properties of a power supply unit for stabilizing a data center electrical system.

FIG. 3 is a flow diagram illustrating an embodiment of a process for determining the properties of a power supply unit for stabilizing a data center electrical system. The process of FIG. 3 may be used to determine the operating impedance envelope for a power supply and data center power system to increase the electrical stability of a data center. In various embodiments, the process may be performed on each data center and the result may be customized for the installation of that particular data center.

At 301, the environment is measured. For example, the electrical elements of a data center are instrumented to measure the electrical properties of the system. In some embodiments, the input and/or output power sources are measured. In various embodiments, the resistance and reactance of elements, including the cables and/or bus bars between all electrical gear, are measured.

At 303, a simulation model of the environment is generated. For example, using the measurements and properties collected at 301, a model of the environment is created. In some embodiments, the impedance, resistance, and reactance values of various elements of the electrical system is approximated by the simulation model. In some embodiments, a simulation model is created for each data center building.

At 305, a simulation is performed to determine the ideal impedance range. Using the model created at 303, an ideal impedance range is determined to increase the electrical stability of the system. In some embodiments, the ideal range maintains the magnitude of the impedance of the power supply unit above the magnitude of the impedance of the data center's electrical system. In some embodiments, the ideal or target impedance range is specified as an impedance envelope. In various embodiments, the ideal impedance range is determined by performing a simulation using the model generated at 303 to determine an acceptable range. For example, using the simulation model generated at 303, a simulation is performed to determine the operating impedance range corresponding to an impedance envelope. In some embodiments, the determined impedance envelope is based on a revised firmware for a power supply unit for adjusting the impedance of the power supply unit. In various embodiments, in order to achieve the targeted ideal impedance range, the phase margin of the entire system, including the data center building and applicable power supplies, is evaluated.

At 307, the impedance envelope is validated to ensure that it conforms to the determined ideal impedance range. For example, a revised firmware is deployed to applicable power supplies and the system is monitored. The data center system is validated to confirm that the impedance envelope conforms to the ideal impedance range determined at 305. In some embodiments, the validation is used to confirm that the determined impedance envelope correctly stabilizes the electrical system. In some embodiments, the validation also confirms that the operating parameters of the power supply unit and in particular that the switch control, such as switch control 203 of FIG. 2, is operating within the correct specifications to increase electrical stability.

Figure 4:
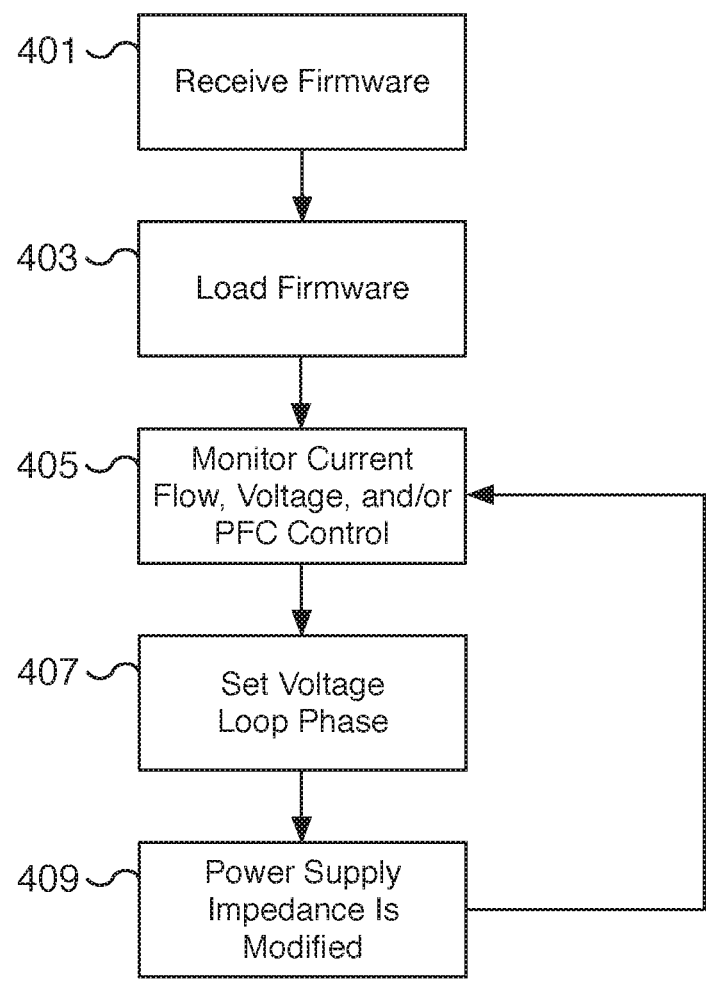
FIG. 4 is a flow diagram illustrating an embodiment of a process for managing the stability of an electrical system for a data center.

FIG. 4 is a flow diagram illustrating an embodiment of a process for managing the stability of an electrical system for a data center. In some embodiments, the process of FIG. 4 is used to configure and operate a power supply to increase the electrical stability of a data center. For example, a firmware for a power supply is received that adjusts the impedance of the power supply relative to the data center resulting in increased electrical stability. In some embodiments, the power supply is installed in a data center rack such as racks 141 and/or 143 of FIG. 1. In various embodiments, the firmware is created after validating the operating parameters of the power supply using the process of FIG. 3.

At 401, a firmware is received. For example, a software firmware update is received at a data center power supply. In various embodiments, the firmware is configured to control the power factor correction (PFC) control functionality of a power supply.

At 403, the firmware is loaded onto a power supply. For example, the firmware is installed on a power supply and used to reconfigure the operation of the power supply. In some embodiments, the installation is performed remotely from a management terminal.

At 405, the current flow, voltage, and/or operation of the power factor correction (PFC) control is monitored. In some embodiments, the properties are monitored using a control loop feedback mechanism such as a PID controller. In some embodiments, the DC voltage stored on a bulk capacitor of the power supply, such as bulk capacitor 207 of FIG. 2, is monitored and held above a constant value. In some embodiments, the line in current is monitored and used to adjust the output and impedance of the power supply by the PFC control module. For example, the output and impedance of the power supply may be adjusted by turning on and off a transistor switch using the PFC control. In various embodiments, the monitoring is configured by the firmware received at 401 and loaded at 403.

At 407, the voltage loop phase of the power supply is set. In various embodiments, achieving the targeted impedance envelope of the power supply and/or data center power system requires adjusting the voltage loop phase margin. In some embodiments, the voltage loop phase is configured by the firmware received at 401 and loaded at 403. In some embodiments, the voltage loop phase is adjusted to increase the phase margin associated with the power supply unit to at least 45 degrees.

At 409, the impedance of the power supply is modified. In some embodiments, the impedance changes in response to setting the voltage loop phase at 407. In some embodiments, the impedance is increased to place a magnitude of an impedance of the power supply unit above a magnitude of an impedance of a network data center power system. In some embodiments, as the impedance of the power supply is adjusted at 409, the process loops back to 405 to continuously monitor the operation of the power supply and to adjust the impedance of the power supply in relation to the impedance of the data center. In some embodiments, the loop back to 405 forms a continuous feedback loop for observing the output of the power supply. For example, the current flow and the voltage of the power supply unit are continuously monitored using a feedback loop.

Figure 5:
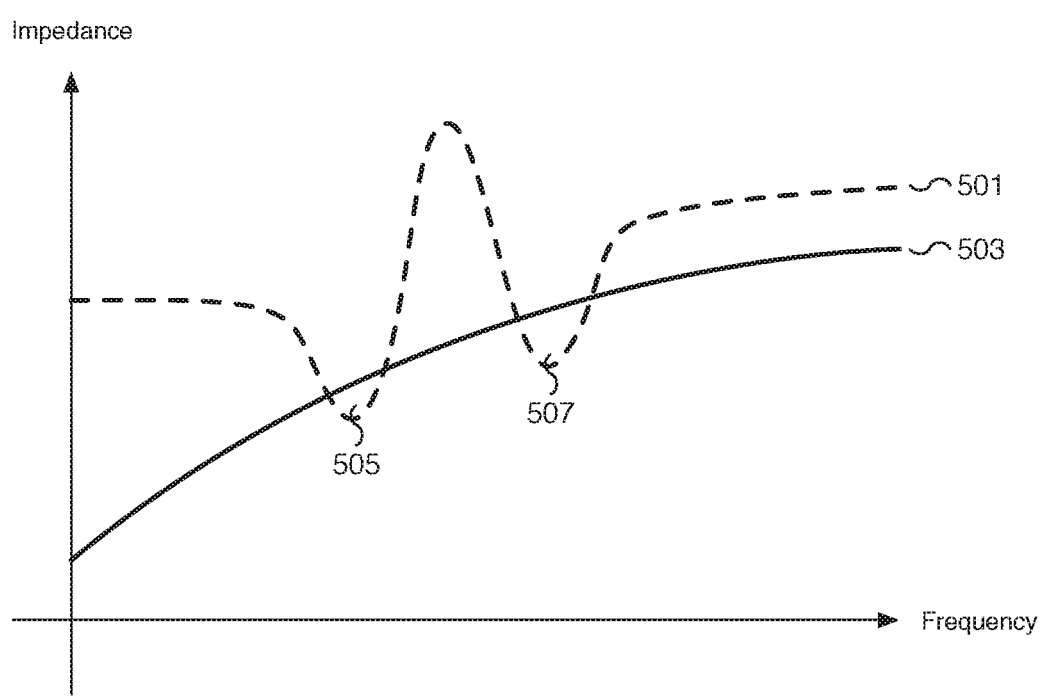
FIG. 5 is a graph illustrating an example of impedance versus frequency for an embodiment of an unstable electrical system for a data center.

FIG. 5 is a graph illustrating an example of impedance versus frequency for an embodiment of an unstable electrical system for a data center. The graph of FIG. 5 depicts the impedance magnitude of a power supply 501, shown as a dotted line, overlaid on the impedance magnitude of the electrical system 503, shown as a solid line. In some embodiments, the graph illustrates the operation of a data center electrical system such as the system of FIG. 1 without an improved power delivery system for increasing electrical stability. In various embodiments, the impedance of the electrical system is the impedance of a network data center power system.

In the graph of FIG. 5, areas 505 and 507 represent frequency intervals where the impedance of the power supply 501 is less than the impedance of the electrical system 503. The areas 505 and 507 correspond to drops in the impedance of the power supply 501. In some scenarios, the drops are a result of a power supply control loop that is not designed with a data center in mind. In some embodiments, the data center impedance changes (rises) because of changeovers to the backup power system. In various embodiments, areas 505 and 507 occur during the operation of the data center including in response to changeovers to backup power sources. During these drops, the electrical system may become unstable and problems such as mechanical vibrations, acoustic noise, and high and/or chaotic currents, among others, may occur. Using the techniques described herein, including the processes of FIGS. 3 and/or 4, the firmware of the power supply is modified to remove areas 505 and 507 and the potential of electrical instability.

Figure 6:
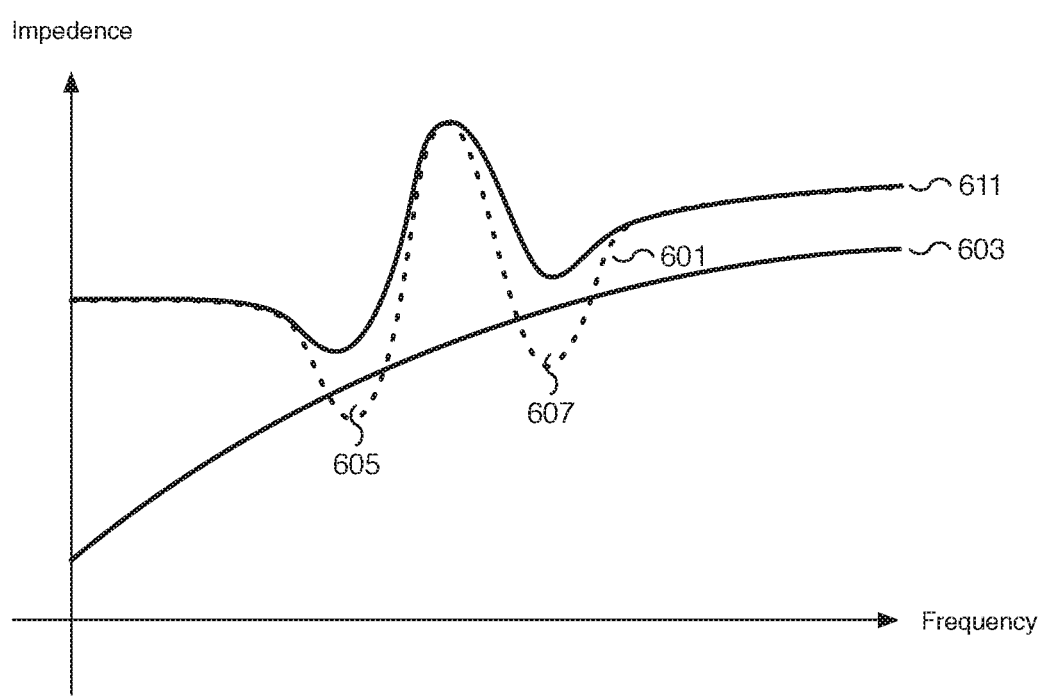
FIG. 6 is a graph illustrating an example of impedance versus frequency for an embodiment of a stable electrical system for a data center.

FIG. 6 is a graph illustrating an example of impedance versus frequency for an embodiment of a stable electrical system for a data center. The graph of FIG. 6 depicts the impedance of an electrical stabilizing power supply 611, shown as the top solid line, and the impedance of the electrical system 603, shown as the bottom solid line. The dotted line depicts the impedance of the unmodified power supply 601. In various embodiments, the impedance of the unmodified power supply 601 is line 501 of FIG. 5 and the impedance of the electrical system 603 is line 503 of FIG. 5. In various embodiments, the impedance of an electrical system, which includes all the cables and/or bus bars of the data center, is difficult to change. In various embodiments, the graph illustrates the operation of a data center electrical system such as the system of FIG. 1 with and without an improved power delivery system to increase electrical stability. In some embodiments, the impedance of an electrically stabilizing power supply 611 corresponds to a power supply associated with the processes of FIGS. 3 and/or 4.

In the graph of FIG. 6, areas 605 and 607 represent frequency intervals where the impedance of the unmodified power supply 601 is less than the impedance of the electrical system 603. The areas 605 and 607 correspond to drops in the impedance of the unmodified power supply 601. In some embodiments, areas 605 and 607 are areas 505 and 507, respectively, of FIG. 5. Using the techniques described herein, including the processes of FIGS. 3 and/or 4, the firmware of the power supply is modified to remove areas 605 and 607 and the potential of corresponding periods of electrical instability. The result of operating the power supply with the revised firmware is depicted by the impedance of an electrical stabilizing power supply 611. In various embodiments, the magnitude of the impedance of the power supply is raised to prevent areas 605 and 607 from occurring.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   measuring an environment of an electrical system associated with a power supply unit;
   generating a simulation model of the measured environment;
   determining an ideal impedance range;
   performing a simulation to determine an impedance envelope;
   receiving at the power supply unit, control logic firmware specifying a configuration selected to place a magnitude of an impedance of the power supply unit above a magnitude of an impedance of a network data center power system; and
   executing the control logic firmware using a power factor correction circuit of the power supply unit including by setting a voltage loop phase margin of the power factor correction circuit to maintain the magnitude of the impedance of the power supply unit above the magnitude of the impedance of the network data center power system.

2. The method of claim 1, wherein the voltage loop phase margin is set to at least 45 degrees.

3. The method of claim 1, further comprising validating the impedance envelope conforms to the ideal impedance range.

4. The method of claim 1, wherein the power supply unit includes an input diode bridge, a power factor correction circuit, an L-boost inductor, a bulk capacitor, and a DC-DC step down voltage regulator.

5. The method of claim 4, wherein the DC-DC step down voltage regulator generates a 12.6 V DC output.

6. The method of claim 5, wherein the DC-DC step down voltage regulator receives a 450 V DC output.

7. The method of claim 1, wherein the power factor correction circuit includes a PID controller configured to adjust the voltage loop phase margin.

8. The method of claim 1, wherein the power supply unit is used to power a computer server of a data center.

9. The method of claim 8, wherein the data center includes an electrical substation, a transformer, a main switch board, one or more switch boards, one or more power panels, and one or more racks.

10. The method of claim 9, wherein the power supply unit is installed in one of the one or more racks.

11. The method of claim 10, wherein the power supply unit is connected to one of the one or more power panels.

12. The method of claim 9, wherein the electrical substation is electrically connected to a regional electrical utility service.

13. The method of claim 12, wherein the data center further includes a main switch board reserve and one or more diesel generators.

14. The method of claim 1, further comprising monitoring a current flow and a voltage of the power supply unit.

15. The method of claim 14, wherein the current flow corresponds to an input current received at the power supply unit and the voltage corresponds to a stored voltage across a bulk capacitor of the power supply unit.

16. The method of claim 14, wherein the current flow and the voltage of the power supply unit are continuously monitored using a feedback loop.

17. The method of claim 1, wherein the power supply unit transforms an input sinusoidal-line-to-neutral voltage to a regulated DC voltage.

18. A system, comprising:
   a processor; and
   a memory coupled with the processor, wherein the memory is configured to provide the processor with instructions which when executed cause the processor to:
      measure an environment of an electrical system associated with a power supply unit;
      generate a simulation model of the measured environment;
      determine an ideal impedance range; and
      perform a simulation to determine an impedance envelope; and
   the power supply unit, configured to:
      receive control logic firmware specifying a configuration selected to place a magnitude of an impedance of the power supply unit above a magnitude of an impedance of a network data center power system; and
      execute the control logic firmware using a power factor correction circuit of the power supply unit including by setting a voltage loop phase margin of the power factor correction circuit to maintain the magnitude of the impedance of the power supply unit above the magnitude of the impedance of the network data center power system.

19. The system of claim 18, wherein the voltage loop phase margin is set to at least 45 degrees.

20. A computer program product, the computer program product being embodied in a non-transitory computer readable storage medium and comprising computer instructions for:
   measuring an environment of an electrical system associated with a power supply unit;

generating a simulation model of the measured environment;
determining an ideal impedance range;
performing a simulation to determine an impedance envelope;
receiving at the power supply unit, control logic firmware specifying a configuration selected to place a magnitude of an impedance of the power supply unit above a magnitude of an impedance of a network data center power system; and
executing the control logic firmware using a power factor correction circuit of the power supply unit including by setting a voltage loop phase margin of the power factor correction circuit to maintain the magnitude of the impedance of the power supply unit above the magnitude of the impedance of the network data center power system.

* * * * *